(12) United States Patent
Morishita et al.

(10) Patent No.: US 7,652,927 B2
(45) Date of Patent: Jan. 26, 2010

(54) SEMICONDUCTOR MEMORY DEVICE

(75) Inventors: Fukashi Morishita, Tokyo (JP);
Kazutami Arimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 436 days.

(21) Appl. No.: 11/797,804

(22) Filed: May 8, 2007

(65) Prior Publication Data
US 2007/0263466 A1    Nov. 15, 2007

(30) Foreign Application Priority Data
May 11, 2006    (JP) .............................. 2006-132895

(51) Int. Cl.
*G11C 16/06*    (2006.01)
(52) U.S. Cl. .......................... 365/185.21; 365/185.22; 365/185.09; 365/185.23; 365/185.26
(58) Field of Classification Search ............ 365/185.21, 365/185.22, 185.23, 185.09, 185.26
See application file for complete search history.

(56) References Cited
U.S. PATENT DOCUMENTS
6,026,024 A * 2/2000 Odani et al. ............ 365/185.22
6,373,748 B2 * 4/2002 Ikehashi et al. ........ 365/185.22
7,558,137 B2 * 7/2009 Inaba et al. ................. 365/201

FOREIGN PATENT DOCUMENTS
JP    2005-302077 A    10/2005
JP    2005-332495 A    12/2005
JP    2006-73055 A    3/2006

OTHER PUBLICATIONS

T. Gyohten et al., "A Capacitories Twin-Transistor Random Access Memory (TTRAM) onSOI," The Institute of Electronics, Information and Communication Engineers, IEICE Technical Report, vol. 105, No. 349, pp. 107-112, Oct. 20, 2005.

* cited by examiner

*Primary Examiner*—Connie C Yoha
(74) *Attorney, Agent, or Firm*—McDermott Will & Emery LLP

(57) ABSTRACT

When data "1" is stored in a memory cell, a bit line is driven to an H level (control line drive potential) and the other bit line is driven to an L level (reference potential) when a sense operation is completed. When a verify write operation is initiated, a charge line is driven from an H level (power supply potential) to an L level (reference potential). By the GIDL current from a source line, accumulation of holes is initiated again for a storage node subsequent to discharge of holes, whereby the potential of the storage node rises towards an H level (period α). When the charge line is driven to an H level from an L level, the potential of the storage node further rises (period β).

16 Claims, 11 Drawing Sheets

SEMICONDUCTOR MEMORY DEVICE

BACKGROUND OF THE INVENTION

1. Field of the Invention

The present invention relates to random access semiconductor memory devices, and more particularly to the technique of employing a memory cell that is formed including a transistor with a storage node.

2. Description of the Background Art

Although the DRAM (Dynamic Random Access Memory) formed of stacked type or trench type memory capacitors and transistors for switching assumes a dominant position in the field of semiconductor memory devices of high density, it is now reaching the scaling limitation due to the difficulty in microminiaturization of the memory capacitor. Under such circumstances, there is proposed a memory cell that employs the transistor per se as the capacitor element as an alternative to the configuration that includes a memory capacitor such as the DRAM.

Among such new type of memory cells, there is known a promising twin transistor RAM (TTRAM: Twin Transistor Random Access Memory). For example, T. Gyohten et al. disclose, in "A Capacitorless Twin-Transistor Random Access Memory (TTRAM) on SOI", THE INSTITUTE OF ELECTRONICS, INFORMATION AND COMMUNICATION ENGINEERS, IEICE Technical Report, vol. 105, No. 349, pp. 107-112, Oct. 20, 2005, a capacitorless twin-transistor RAM having charge accumulated at a floating body region of an SOI (Silicon On Insulate) transistor to store data.

Further, Japanese Patent Laying-Open No. 2005-302077 discloses a semiconductor memory device including a memory cell (FBC: Floating Body Cell) for storing data by accumulating or releasing charge with respect to a floating body region that is electrically in a floating state.

In such a memory cell that employs a transistor per se as a capacitor element, the read current flows through the neighborhood of a storage node that accumulates charge, and current leakage occurs through the junction between the storage node and an adjacent source region or drain region. Accordingly, there was a problem that the retaining capability of stored data is degraded in the aspect of dynamic noise from a control line or the like electrically connected to the memory cell.

SUMMARY OF THE INVENTION

In view of the foregoing, an object of the present invention is to provide a semiconductor memory device improved in the retaining capability of stored data in data readout.

Another object of the present invention is to provide a semiconductor memory device improved in the retaining capability of stored data during a period where memory access is not executed.

A semiconductor memory device according to an aspect of the present invention includes a plurality of memory cells arranged in rows and columns, a bit line provided corresponding to each column of memory cells, a sense amplifier circuit provided corresponding to each bit line pair formed of bit lines, and a control circuit. Each of the memory cells includes a storage transistor having a storage node to accumulate an amount of charge according to data, and an access transistor connected in series with the storage transistor. Each memory cell is connected between a corresponding bit line and source line, and configured to change current flowing through a relevant bit line according to the amount of charge accumulated in the storage node. The sense amplifier circuit reads out data of a target memory cell based on current flowing to a corresponding bit line from the memory cell, and then supplies voltage according to the read data to a relevant bit line pair. The control circuit effects control such that a read operation is conducted by a sense amplifier circuit corresponding to a target memory cell for reading in a state of the storage transistor of the target memory cell being active, and then effects control such that the read data is rewritten to the target memory cell.

A semiconductor memory device according to another aspect of the present invention includes a plurality of memory cells arranged in rows and columns, a bit line provided corresponding to each column of memory cells, a source line to supply predetermined potential to each of the plurality of memory cells, and a control circuit. Each of the memory cells includes a storage transistor having a storage node to accumulate an amount of charge according to data. The storage transistor includes a channel formation region, first and second impurity diffusion regions opposite to each other with the channel formation region therebetween, and a gate electrode arranged in proximity to the channel formation region. The storage node is formed in contact with the channel formation region at the side opposite to the side where the gate electrode is arranged. The source line is electrically connected to the first impurity diffusion region. Further, the control circuit is configured to allow execution of a data retaining mode in which the potential difference between the storage node and the first impurity diffusion region is reduced.

According to the former aspect of the invention, a semiconductor memory device improved in the retaining capability of stored data in data readout can be realized. According to the latter aspect of the present invention, a semiconductor memory device improved in the retaining capability of stored data during a period where memory access is not executed can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
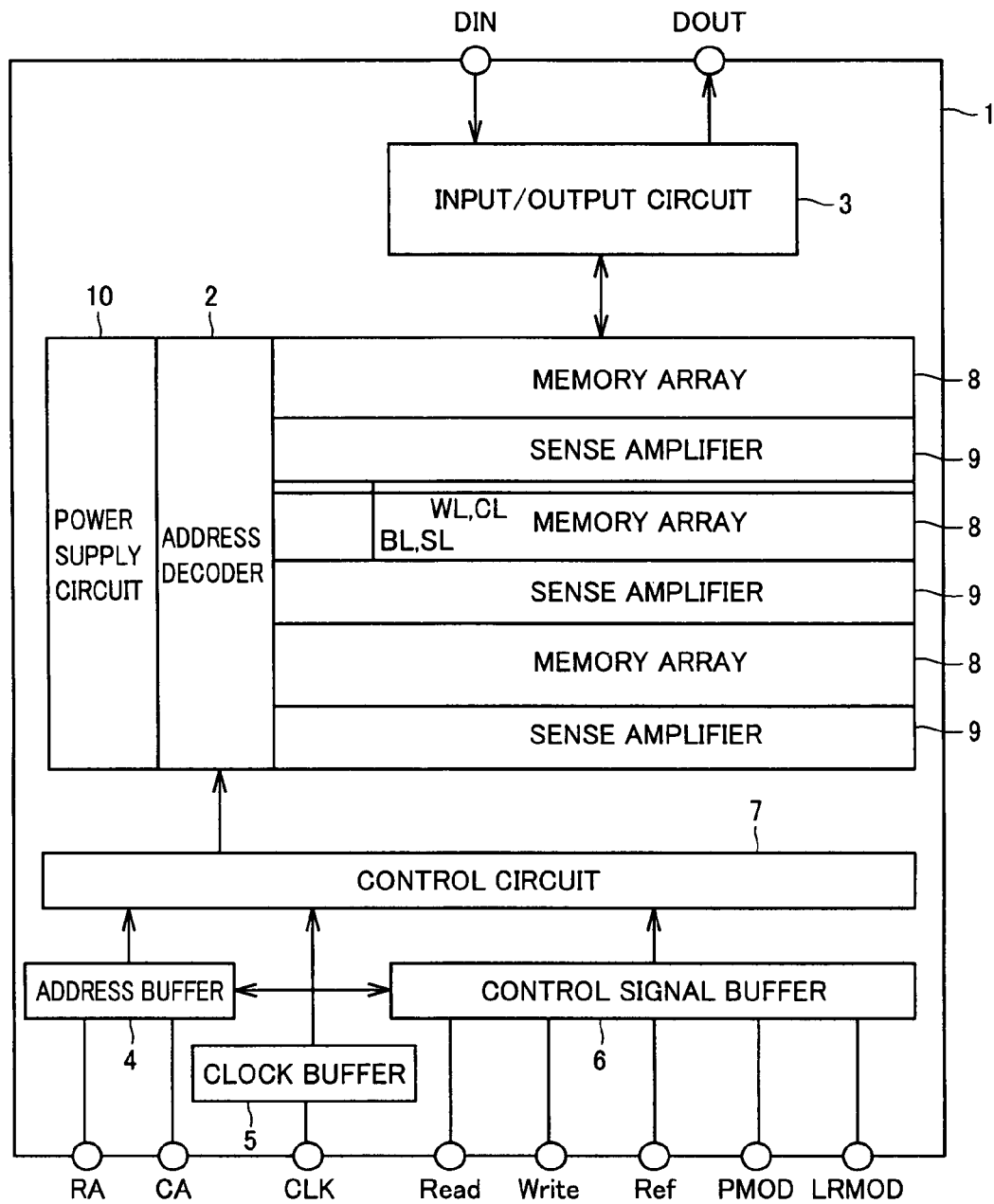
FIG. 1 is a schematic diagram of a configuration of a semiconductor memory device according to a first embodiment of the present invention.

Embodiments of the present invention will be described in detail hereinafter with reference to the drawings. In the drawings, the same or corresponding elements have the same reference characters allotted, and description thereof will not be repeated.

First Embodiment

Referring to FIG. 1, a semiconductor memory device 1 according to a first embodiment of the present invention includes an address decoder 2, an input/output circuit 3, an address buffer 4, a clock buffer 5, a control signal buffer 6, a control circuit 7, a memory array 8, a sense amplifier 9, and a power supply circuit 10.

Address decoder 2 is configured including a row address decoder (not shown) and a column address decoder (not shown). Address decoder 2 responds to a control command, based on a row address signal RA and a column address signal CA applied to a terminal of semiconductor memory device 1 from an external source, to selectively drive a plurality of word lines WL and charge lines CL arranged along the row direction of memory array 8, as well as a plurality of bit lines BL and source lines SL arranged along the column direction of memory array 8.

Sense amplifier 9 includes a sense amplifier circuit corresponding to each bit line pair. Two bit lines BL adjacent to each other constitute one bit line pair.

In data reading, input/output circuit 3 provides the output of the sense amplifier circuit, selected by the column address decoder, outside of semiconductor memory device 1 as output data DOUT. In data writing, input/output circuit 3 amplifies externally applied input data DIN of semiconductor memory device 1, and then writes input data DIN into the memory cell selected by the row address decoder and column address decoder.

Address buffer 4, clock buffer 5 and control signal buffer 6 transmit an externally applied address signal (row address signal RA, column address signal CA), and also a clock signal CLK and control signal (readout signal Read, write signal Write, reference signal Ref, page access mode signal PMOD, and the like) to control circuit 7.

Power supply circuit 10 generates a plurality of levels of potential (power supply potential VDD, reference potential Vref, control line drive potential VBL, and the like) required for the operation of semiconductor memory device 1 such as a read/write operation.

Control circuit 7 controls the data reading and writing operation in semiconductor memory device 1 by applying a control command to address decoder 2 based on externally applied control signals, address signals, and the like.

Particularly in the first embodiment of the present invention, control circuit 7 effects data reading from a target memory cell in memory array 8 by sense amplifier 9, and then rewrites the relevant read data into the target memory cell (hereinafter, also referred to as "verify write operation"). By virtue of the verify write operation, the effect of erroneous writing into a memory cell in association with a reading operation (the so-called "reading disturb") is avoided.

Figure 2:
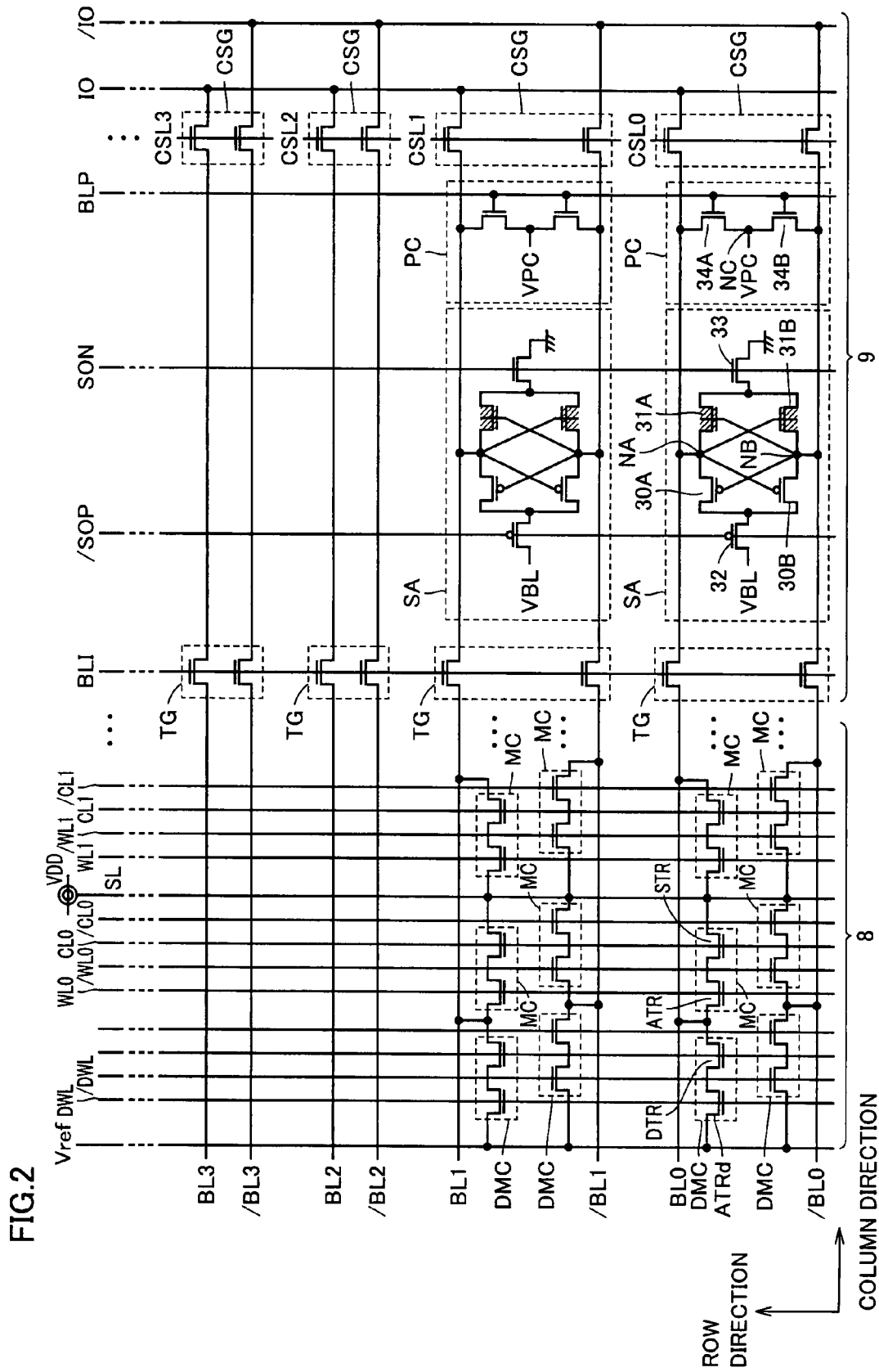
FIG. 2 is a schematic diagram of a main part of a memory array and a sense amplifier of a semiconductor memory device.

Referring to FIG. 2, memory array 8 includes a plurality of memory cells MC arranged in rows and columns. Bit lines BL0, /BL0, BL1, /BL1, . . . are arranged corresponding to respective columns of memory cells MC. Each memory cell MC includes a storage transistor STR having a charge accumulation node (hereinafter, also referred to as "storage node") to accumulate an amount of charge according to data (for example, a binary of "0" or "1"), and an access transistor ATR connected in series with storage transistor STR. Each memory cell MC is connected between a corresponding bit line and a power supply potential VDD supplied via source line SL and is configured to change the current flowing through a connected bit line according to the amount of charge accumulated in the storage node.

Memory array 8 also includes a dummy cell DMC connected between each of bit lines BL0, /BL0, BL1, /BL1, . . . and reference potential Vref. Dummy cell DMC supplies reference current that is the comparison reference for the current flowing from memory cell MC to a connected bit line. Specifically, dummy cell DMC includes a dummy transistor DTR formed to generate current of a value qualified as the intermediate value of the current flowing through a bit line corresponding to the binary data ("0" or "1") stored in memory cell MC, and a dummy access transistor ATRd connected in series with dummy transistor DTR. Dummy transistor DTR is formed of, for example, a body fixed transistor, having the potential of the storage node fixed at half the power supply potential VDD (½ VDD).

For memory array 8, a word line pair WL0, /WL0, a word line pair WL1, /WL1 . . . are provided corresponding to each row of memory cells MC, and a dummy word line pair DWL, /DWL is provided along the direction of the row of dummy cells DMC. Word lines WL0 and /WL0 constituting word line pair WL0, /WL0 are shared by respective access transistors ATR of memory cells at an even numbered column and an odd numbered column among the corresponding memory cells MC. Specifically, word line WL0 is connected to respective gate electrodes of access transistors ATR of memory cells MC connected to bit lines BL0, BL1, . . . of an even numbered column among memory cells MC arranged in the corresponding row. Word line /WL0 is connected to respective gate electrodes of access transistors ATR of memory cells MC connected to bit lines /BL0, /BL1, . . . of an odd numbered column among memory cells MCs arranged in a corresponding row. Dummy word lines DWL and /DWL are shared by dummy access transistors ATRd of dummy cells DMC of an even numbered column and an odd numbered column, respectively.

Similarly, charge line pairs CL0, /CL0, CL1, /CL1, . . . are arranged corresponding to each row of memory cells MC in memory array 8. For example, charge lines CL0 and /CL0 constituting charge line pair CL0, /CL0 are shared by storage transistors STR of memory cells MC at an even numbered column and an odd numbered column among the corresponding memory cells MC, respectively. Specifically, charge line CL0 is connected to respective gate electrodes of storage transistors STR of memory cells MC connected to bit lines BL0, BL1, . . . arranged at relevant even numbered columns among memory cells MC of a corresponding row. Charge line /CL0 is connected to respective gate electrodes of storage transistors STR of memory cells MC connected to bit lines /BL0, /BL1, . . . arranged at relevant odd numbered columns among memory cells MC of a corresponding row.

In the following description, a bit line pair will be represented as BL, /BL, a bit line as BL (or /BL), a word line pair as WL, /WL, a word line as WL (or /WL), a charge line pair as CL, /CL, and a charge line as CL (or /CL), when indicated generically. Further, the binary states of high voltage and low voltage of the signal, control line, data, and the like will also be called an "H level" and "L level".

Sense amplifier 9 includes a sense amplifier circuit SA provided corresponding to each bit line pair BL, /BL formed of two adjacent bit lines BL and /BL. Sense amplifier circuit SA reads out data of a target memory cell MC selected by word line WL (or /WL) based on the current flowing from the target memory cell MC to a corresponding bit line BL (or /BL), and then supplies voltage according to read data to a corresponding bit line pair BL, /BL.

Specifically, sense amplifier circuit SA is formed of transistors 30A, 30B, 31A, 31B, 32, and 33. Transistors 30A, 30B, 31A and 31B constitute the so-called flip-flop circuit. Transistors 32 and 33 constitute a drive gate to drive the relevant flip-flop circuit. Transistors 30A and 31A are connected in series. The connection node NA thereof is connected to bit line BL. Transistors 30B and 31B are connected in series. The connection node NB thereof is connected to bit line /BL. Bit line /BL is connected to respective gate electrodes of transistors 30A and 31A. Bit line BL is connected to respective gate electrodes of transistors 30B and 31B. Further, transistors 30A and 31A as well as transistors 30B and 31B connected in series are connected in parallel between control line drive potential VBL and reference potential via transistors 32 and 33. In the first embodiment of the present invention, control line drive potential VBL is designed to be equal to half (½ VDD) the power supply potential VDD.

Sense amplifier 9 has sense amplifier drive line pair /SOP, SON arranged along the row direction. In each sense amplifier circuit SA, sense amplifier drive line SON is connected to the gate electrode of transistor 33 arranged at the reference potential side, whereas sense amplifier drive line /SOP is connected to the gate electrode of transistor 32 arranged at control line drive potential VBL side. Therefore, when sense amplifier drive line pair /SOP, SON is driven by address decoder 2 (FIG. 1) in response to a control command from control circuit 7 (FIG. 1), all sense amplifier circuits SAs are rendered active.

Transistors 30A, 30B, and 32 are formed of, for example, P channel MOS transistors. Transistors 31A, 31B, and 33 are formed of, for example, N channel MOS transistors. Each of transistors 31A and 31B is preferably a gate-body direct-coupled transistor having the gate electrode electrically connected to its body region, as will be described afterwards.

Sense amplifier 9 further has a precharge circuit PC arranged corresponding to each bit line pair BL, /BL. Precharge circuit PC supplies precharge potential VPC to a corresponding bit line pair BL, /BL prior to initiating a data reading operation.

Specifically, precharge circuit PC is formed of transistors 34A and 34B connected in series between bit line BL and bit line /BL. Precharge potential VPC is supplied to the connection node NC thereof.

Sense amplifier 9 further has a bit line precharge line BLP arranged along the row direction. In each precharge circuit PC, bit line precharge line BLP is connected to respective gate electrodes of transistors 34A and 34B. Therefore, in response to address decoder 2 (FIG. 1) driving bit line precharge line BLP according to a control command from control circuit 7 (FIG. 1), transistors 34A and 34B are rendered active, whereby precharge potential VPC is supplied to all bit lines BL and /BL. In the first embodiment of the present invention, the ground precharge scheme of setting precharge potential VPC equal to reference potential is employed.

Sense amplifier 9 further includes an input/output gate CSG provided corresponding to each bit line pair BL, /BL to allow electrical connection/disconnection between a corresponding sense amplifier circuit SA and a data input/output line pair IO, /IO. According to column select lines CSL0, CSL1, CSL2, CSL3, . . . provided corresponding to each input/output gate CSG, input/output gate CSG transmits the voltage, supplied from a corresponding sense amplifier circuit SA to bit line pair BL, /BL, to data input/output line pair IO, /IO.

Specifically, input/output gate CSG is formed of two transistors, each provided corresponding to a relevant one of bit lines BL and bit line /BL. Each transistor is rendered active to attain a conductive state when respective column select lines CSL0, CSL1, CSL2, CSL3, . . . are driven to an H level. In the following description, the representation of CSL will be employed to collectively indicate the column select lines.

Data input/output line pair IO, /IO transmits a voltage signal output from input/output gate CSG selected by column select line CSL to input/output circuit 3 (FIG. 1).

Sense amplifier 9 further includes a transfer gate TG provided corresponding to each bit line pair BL, /BL to allow electrical connection/disconnection between a corresponding sense amplifier circuit SA and memory cell MC. Transfer gate TG shares a bit isolation line BLI arranged along the row direction to be rendered active to attain a conductive state when address decoder 2 (FIG. 1) drives bit isolation line BLI to an H level. Specifically, transfer gate TG is formed of two transistors, each provided corresponding to a relevant one of bit lines BL and bit line /BL.

Figure 3:
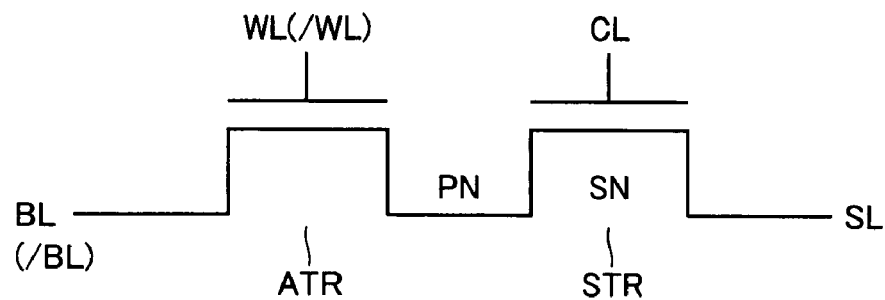
FIG. 3 represents an equivalent circuit of a memory cell.

Referring to FIG. 3, memory cell MC includes a storage transistor STR having a storage node SN, and an access transistor ATR connected in series via a node PN. Specifically, one memory cell MC is formed including one storage transistor STR and one access transistor ATR.

The node opposite to node PN of storage transistor STR is connected to source line SL. The gate electrode of storage transistor STR is connected to charge line CL. The node opposite to node PN of access transistor ATR is connected to bit line BL (or /BL). The gate electrode of access transistor ATR is connected to word line WL (or /WL).

Figure 4:
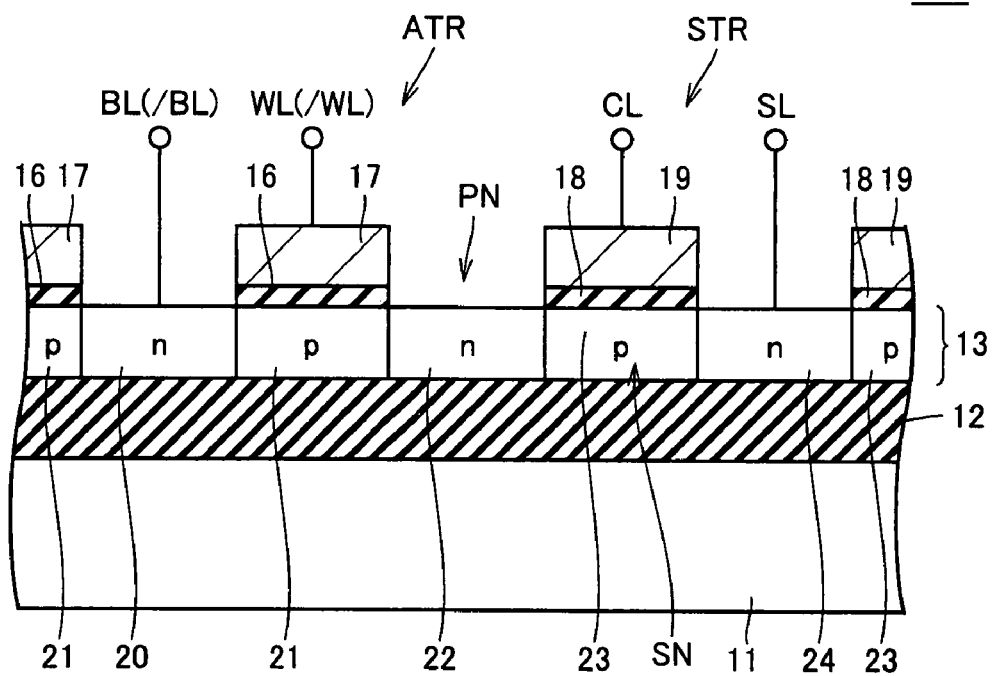
FIG. 4 is a schematic sectional view of a memory cell.

Referring to FIG. 4, memory cell MC is formed as the so-called SOI (Silicon On Insulation) transistor, having the body maintained at the floating potential. Specifically, a silicon layer 13 is formed on a silicon substrate 11 that is a semiconductor substrate with a buried oxide layer 12 that is an insulating layer thereunder. Storage transistor STR includes a channel formation region 23, and n-type impurity diffusion regions 22 and 24, formed at silicon layer 13, as well as a gate oxide film 18 and a gate electrode 19. Impurity diffusion regions 22 and 24 are formed to pass through silicon layer 13 from the top surface thereof to arrive at buried oxide layer 12. Impurity diffusion regions 22 and 24 are arranged opposite to each other with channel formation region 23 therebetween. Impurity diffusion region 22 corresponds to node PN (FIG. 3).

Channel formation region 23 is formed in silicon layer 13 at the side where gate electrode 19 is arranged (upper side in drawing sheet of FIG. 4). Gate electrode 19 is arranged in proximity to channel region 23 (the upper side in the drawing sheet of FIG. 4) via gate oxide film 18.

Storage node SN is formed in silicon layer 13 in contact with channel formation region 23 at the side opposite to the side where gate electrode 19 is arranged (the bottom side in the drawing sheet of FIG. 4). Storage node SN is electrically isolated by an element isolation insulating film (not shown). Therefore, storage node SN is maintained at the floating potential by buried oxide layer 12 stacked between silicon substrate 11 and silicon layer 13, and the element isolation insulating film (not shown).

Impurity diffusion region 24 is connected to source line SL. Gate electrode 19 is connected to charge line CL.

Access transistor ATR includes channel formation region 21, and n-type impurity diffusion regions 20 and 22, formed at silicon layer 13, as well as a gate oxide film 16 and a gate electrode 17. Impurity diffusion region 20 is formed to pass through silicon layer 13 from the top surface thereof to arrive at buried oxide layer 12. Impurity diffusion regions 20 and 22 are located opposite to each other with channel formation region 21 therebetween. Gate electrode 17 is arranged in proximity to channel formation region 21 (the upper side in the drawing sheet of FIG. 4) via gate oxide film 16. Impurity diffusion region 20 is connected to bit line BL (or /BL). Gate electrode 17 is connected to word line WL (or /WL).

Storage transistor STR stores binary data ("0" or "1") corresponding to the state of a large amount of accumulated holes in storage node SN maintained at the floating potential (a state of relatively low threshold voltage of storage transistor STR), and a state of a low amount of accumulated holes at storage node SN (a state of relatively high threshold voltage of storage transistor STR). According to the amount of charge (number of holes) accumulated at storage node SN, the phenomenon of the threshold voltage being altered is referred to as "the body effect". The following description is based on the case where data "1" is allocated to the state of a large amount of accumulated holes (a state of relatively low threshold voltage), and data "0" is allocated to the state of a low amount of accumulated holes (a state of relatively high threshold voltage).

In the first embodiment of the present invention, channel formation region 23 and channel formation region 21 correspond to "first channel formation region" and "second channel formation region", respectively. Impurity diffusion region 24, impurity diffusion region 22, and impurity diffusion region 20 correspond to "first impurity diffusion region", "second impurity diffusion region", and "third impurity diffusion region", respectively. Furthermore, transistor 30A, transistor 31A, transistor 30B, and transistor 31B correspond to "first transistor", "second transistor", "third transistor", and "fourth transistor", respectively.

In the case where power supply potential VDD is supplied to storage transistor STR via source line SL, the amount of current flowing through storage transistor STR becomes relatively small and relatively large when the threshold voltage is relatively high and relatively low, respectively. Therefore, data stored in storage transistor STR can be read out based on the level of current flowing from storage transistor STR to a corresponding bit line BL (or /BL).

Since only the threshold voltage is to be changed, storage transistor STR per se does not have to supply charge (current) to sense amplifier circuit SA, differing from the memory capacitor employed in a conventional DRAM. Therefore, data reading carried out with respect to storage transistor STR is not the so-called destructive reading that completely erases the stored data as it is being read out.

However, the read current supplied from source line SL flows from impurity diffusion region 24 to impurity diffusion region 22 through channel formation region 23 during data reading. Holes will be introduced into storage node SN in association with the read current. Therefore, when data "0" is stored, i.e. when the amount of accumulated holes is low, the amount of accumulated holes increases in association with the read current, leading to the possibility of data being erroneously written to data "1" from data "0" (read out disturb).

In order to improve the retaining capability of stored data with respect to such read out disturb, the data read out from the target memory cell is provided outside semiconductor memory device 1, and the read data is rewritten into the relevant memory cell in the present first embodiment. Data reading at semiconductor memory device 1 according to the first embodiment of the present invention will be described hereinafter with reference to the operation timing charts of FIGS. 5A-5I.

FIGS. 5A-5I correspond to the case where data reading is effected on memory cell MC arranged at an even numbered column, i.e. connected to bit line BL, in memory array 8 of FIG. 2.

Figure 5A:
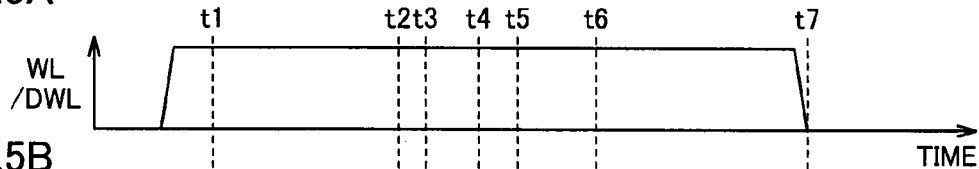
FIGS. 5A-5I are operation timing charts of data reading.
Figure 5B:
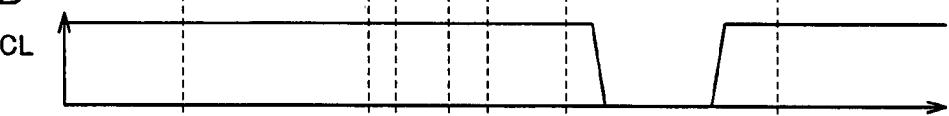
Figure 5C:
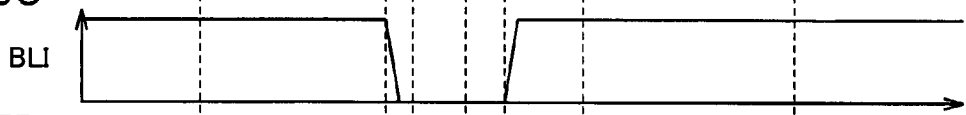
Figure 5D:
Figure 5E:
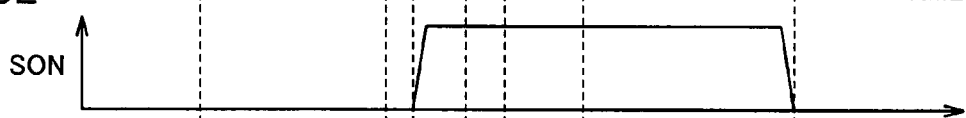
Figure 5F:
Figure 5G:
Figure 5H:
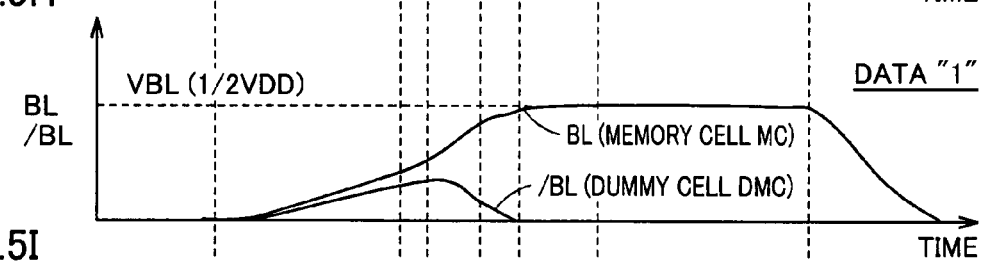
Figure 5I:
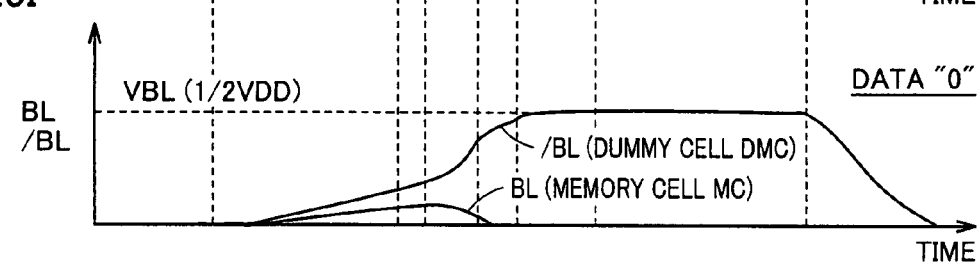

FIG. 5A represents the temporal change in word line WL and dummy word line /DWL. FIG. 5B represents the temporal change in charge line CL. FIG. 5C represents the temporal change in bit isolation line BLI. FIG. 5D represents the temporal change in bit line precharge line BLP. FIG. 5E represents the temporal change in sense amplifier drive line SON. FIG. 5F represents the temporal change in sense amplifier drive line /SOP. FIG. 5G represents the temporal change in column select line CSL. FIG. 5H represents the temporal change in bit lines BL and /BL when data "1" is stored in memory cell MC. FIG. 5I represents the temporal change in bit lines BL and /BL when data "0" is stored in memory cell MC.

(i) Selection of Target Memory Cell for Read Out

Control circuit 7 (FIG. 1) drives word line WL corresponding to target memory cell MC to an H level based on row address signal RA, as shown in FIG. 5A. At the same time, control circuit 7 drives dummy word line /DWL corresponding to dummy cell DMC connected to bit line /BL complementary to bit line BL connected to target memory cell MC to an H level. In response, access transistor ATR of memory cell MC is rendered active, whereby storage transistor STR is electrically connected between source line SL and bit line BL while dummy access transistor ATRd of dummy cell DMC is rendered active, whereby dummy transistor DTR is electrically connected between source line SL and bit line /BL.

In other words, target sense amplifier circuit SA is electrically connected to storage transistor STR via bit line BL, and also electrically connected to dummy transistor DTR via bit line /BL. Prior to time t1, transistors 34A and 34B of precharge circuit PC are both conductive since bit line precharge line BLP is driven to an H level, as shown in FIG. 5D. Therefore, each of bit lines BL and /BL is maintained at the precharge potential (reference potential).

(ii) Read Operation

As shown in FIG. 5B, control circuit 7 effects control such that a read operation is conducted by a sense amplifier circuit SA corresponding to target memory cell MC in a state where charge line CL of target memory cell MC is driven to an H level and storage transistor STR is rendered active (conductive state).

First, control circuit 7 drives bit line precharge line BLP to an L level, as shown in FIG. 5A (time t1). In response, transistors 34A and 34B of precharge circuit PC make the transition to a non-conductive state. Supply of read current and reference current from memory cell MC and dummy cell DMC to bit lines BL and /BL, respectively, is initiated. As shown in FIGS. 5H and 5I, the potential at each of bit lines BL and /BL begins to rise in response to the supply of read current and reference current. The rising rate of the potential of bit lines BL and /BL is determined depending upon the supplied current, i.e. the amount of charge per unit time.

Sense amplifier circuit SA reads out data based on the comparison between the read current flowing through target memory cell MC with the current flowing through dummy cell DMC connected to the bit line /BL of the bit line pair BL, /BL corresponding to the target memory cell MC.

As described above, dummy transistor DTR supplies reference current corresponding to the intermediate level of read current corresponding to data "1" and "0" stored in memory cell MC. Therefore, when data "1" is stored in memory cell MC, the amount of read current supplied from memory cell MC to bit line BL is larger as compared to the reference current supplied from dummy transistor DTR to bit line /BL, as shown in FIG. 5H. Therefore, the potential of bit line BL becomes higher than that of bit line /BL.

In contrast, when data "0" is stored in memory cell MC, the amount of read out current supplied from memory cell MC to bit line BL is lower as compared to reference current supplied from dummy transistor DTR to bit line /BL, as shown in FIG. 5I. Therefore, the potential of bit line BL becomes lower than that of bit line /BL.

As shown in FIGS. 5H and 5I, the occurrence of some time constant for the potential increase of bit lines BL and /BL is mainly attributed to the parasitic capacitance at memory array 8. Therefore, in order to increase the speed of the sense operation (amplification operation) of sense amplifier circuit SA, it is effective to reduce such parasitic capacitance. Control circuit 7 effects control such that the corresponding transfer gate TG is rendered non-conductive to electrically disconnect the corresponding memory cell MC from the currently operating sense amplifier circuit SA in accordance with the reading operation at sense amplifier circuit SA.

Specifically, as shown in FIG. 5C, control circuit 7 drives bit isolation line BLI to an L level when the potential difference between bit lines BL and /BL is increased to a level sufficient for a sense operation at sense amplifier circuit SA (time t2). Referring to FIG. 2 again, when bit isolation line BLI is driven to an L level, transfer gate TG is rendered inactive, whereby memory array 8 is electrically disconnected from sense amplifier circuit SA. The drain-gate voltage of transistors 31A and 31B at sense amplifier circuit SA matches the potential difference between respective bit lines BL and /BL. Therefore, a level sufficient for a sense operation means that the potential difference between bit lines BL and /BL is equal to or greater than the threshold voltage of transistors 31A and 31B.

Then at time t3, control circuit 7 drives sense amplifier drive lines SON and /SOP to an H level and an L level, respectively, as shown in FIGS. 5E and 5F. In response, transistors 32 and 33 of sense amplifier circuit SA shown in FIG. 2 are rendered active, whereby sense amplifier circuit SA is electrically connected between control line drive potential VBL and reference potential.

When data "1" is stored in memory cell MC, reference potential is supplied to bit line /BL since transistor 31B is rendered active prior to time t3. Accordingly, the potential difference between control line drive potential VBL and the reference potential is supplied across the drain and gate of transistor 30A, whereby transistor 30A is rendered active. Therefore, control line drive potential VBL is supplied to bit line BL.

In contrast, when data "0" is stored in memory cell MC, reference potential is supplied to bit line BL since transistor 31A is rendered active prior to time t3. Accordingly, the potential difference between control line drive potential VBL and reference potential is supplied across the drain and gate of transistor 30B, whereby transistor 30B is rendered active. Therefore, control line drive potential VBL is supplied to bit line /BL.

Thus, sense amplifier circuit SA reads out the data of target memory cell MC, and supplies the voltage of a level corresponding to the read data to bit line pair BL, /BL. As a result, the potentials of bit lines BL and /BL gradually change according to the read data at time t3 and et seq., as shown in FIGS. 5H and 5I.

In the state where sense amplifier circuit SA supplies voltage corresponding to the read data to bit line pair BL, /BL, control circuit 7 drives column select line CSL corresponding to target memory cell MC to an H level based on column address signal CA (time t4). In response, the corresponding input/output gate CSG is rendered active, and the voltage supplied to bit line pair BL, /BL from sense amplifier circuit SA is transmitted to data input/output line pair IO, /IO. Then, the voltage transmitted to data input/output line pair IO, /IO is provided out from semiconductor memory device 1 as output data DOUT via input/output circuit 3 (FIG. 1).

As shown in FIG. 5C, control circuit 7 drives bit isolation line BLI to an H level at time t5 subsequent to each of bit lines BL and /BL arriving at the level of control line drive potential VBL and reference potential to prepare for a verify write operation that will be described afterwards. Accordingly, transfer gate TG shown in FIG. 2 is rendered active, and memory array 8 is electrically connected to sense amplifier circuit SA again.

(iii) Verify Write Operation (Rewriting Operation of Read Data)

As mentioned above, read out disturb may occur at memory cell MC that includes a storage transistor STR. Therefore, control circuit 7 effects control to conduct a verify write operation, i.e. rewriting the read data to the target memory cell MC after the read out operation.

As shown in FIG. 5G, control circuit 7 drives column select line CSL to an L level at time t6 following the output of read data. In response, corresponding input/output gate CSG is rendered inactive, and bit line pair BL, /BL is electrically disconnected from data input/output line pair IO, /IO.

Then, control circuit 7 drives charge line CL corresponding to target memory cell MC to an L level (reference potential) in the state where voltage corresponding to the read data is supplied to bit line pair BL, /BL from sense amplifier circuit SA. Accordingly, a state of accumulated holes corresponding to the read data is established again at storage node SN of memory cell MC. In other words, the read data is written again to memory cell MC. Then, following an elapse of the time required for reestablishment of the state of accumulated holes at storage node SN of memory cell MC, control circuit 7 drives charge line CL to an H level (power supply potential VDD) to return to the former state.

Eventually, control circuit 7 restores each control line to the state prior to the read operation at time t7 when the verify write operation is to be completed. In other words, control circuit 7 drives word line WL and dummy word line /DWL to an L level, as shown in FIG. 5A, drives bit line precharge line BLP to an H level as shown in FIG. 5D, and drives sense amplifier drive lines SON and /SOP to an L level and an H level, respectively, as shown in FIGS. 5E and 5F.

<Verify Write Operation>

Figure 6A:
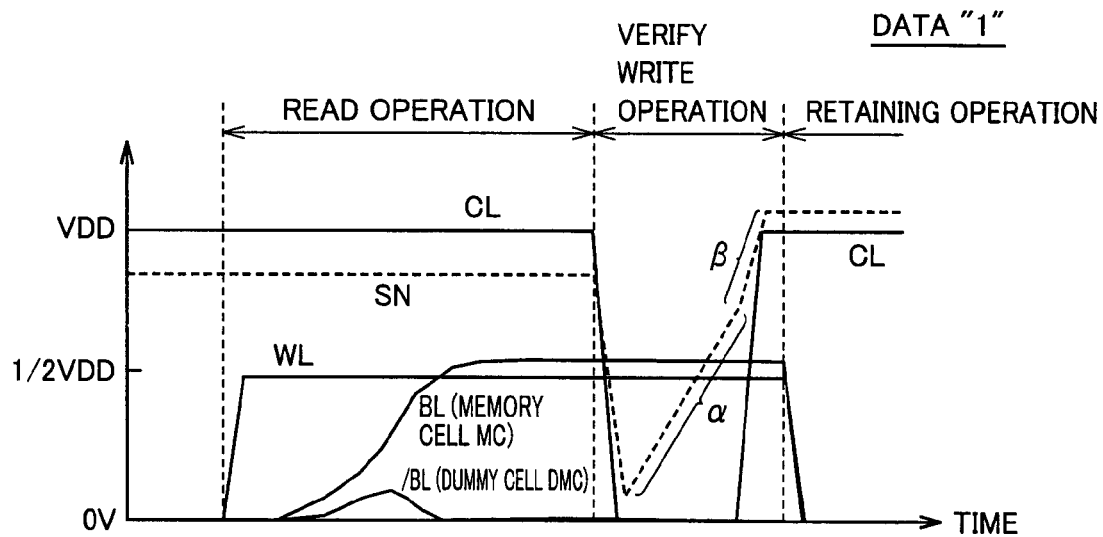
FIGS. 6A and 6B are timing charts to describe in further detail a verify write operation.
Figure 6B:
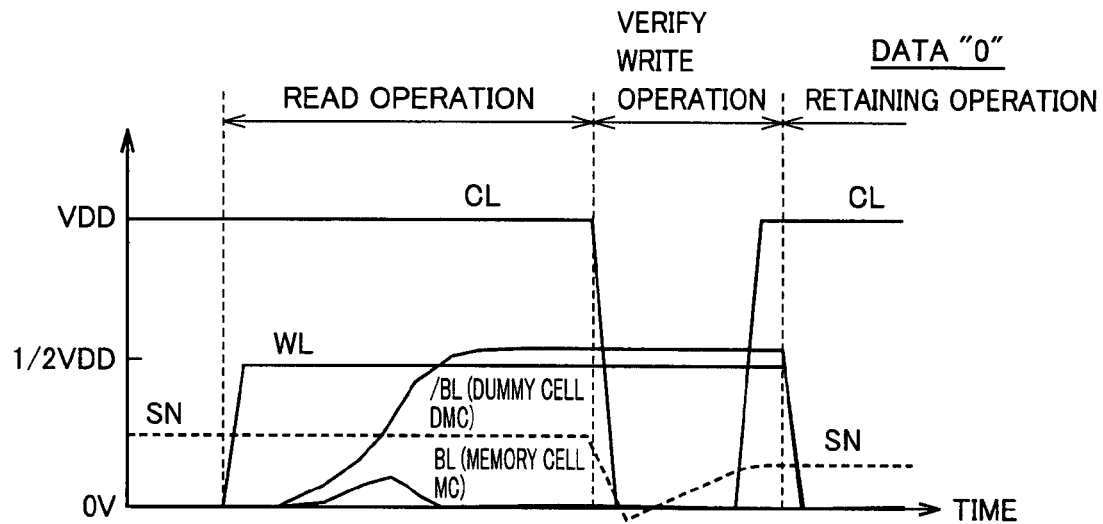

FIGS. 6A and 6B are timing charts to describe in further detail a verify write operation.

FIGS. 6A and 6B corresponds to the case where data "1" is stored in memory cell MC and data "0" is stored in memory cell MC, respectively.

Referring to FIG. 6A, charge line CL connected to the gate electrode of storage transistor STR is driven to an H level during a reading operation period and retaining operation period. In the case where data "1" is stored in memory cell MC, storage node SN is maintained at the state where many holes are accumulated. When the sense operation of sense amplifier circuit SA is completed in such a state, bit line BL is driven to an H level (control line drive potential VBL) whereas bit line /BL is driven to an L level (reference potential).

When a verify write operation is initiated, charge line CL is driven from an H level (power supply potential VDD) to an L level (reference potential). Accordingly, storage transistor STR is temporarily rendered inactive. In accordance with this potential reduction at charge line CL, the potential of storage node SN is reduced from an H level (power supply potential VDD) to an L level (reference potential) by the capacitive coupling between the gate electrode and body region of storage transistor STR (hereinafter, also referred to as "gate coupling"). Thus, a state where the amount of accumulated hole is low (the state where the amount of accumulated holes is substantially "0") is established at storage node SN.

Since the potentials of word line WL and bit line BL are both at an H level (control line drive potential VBL), access transistor ATR of memory cell MC (FIG. 3) is rendered inactive. Therefore, node PN corresponds to the floating potential.

Accordingly, a potential difference corresponding to power supply potential VDD is generated between storage node SN and source line SL. In other words, a relatively high electric field is generated at the junction between storage node SN and impurity diffusion region 24 shown in FIG. 4. Although storage transistor STR is inactive since potential of an L level is supplied to the gate electrode of storage transistor STR, leakage current (flow of holes) occurs from impurity diffusion region 24 towards storage node SN. This leakage current is also referred to as GIDL (Gate Induced Drain Leakage) current.

Therefore, accumulation of holes is resumed by the GIDL current from source line SL at storage node SN that has once discharged the holes. Therefore, the potential of storage node SN increases from the L level towards the H level (period α).

When holes are introduced sufficiently into storage node SN by GIDL current, charge line CL is driven to an H level from an L level. Accordingly, storage transistor STR is rendered active again. By the gate coupling effect, the potential of storage node SN further increases (period β).

Then, word line WL and bit line pair BL, /BL are driven to an L level. Thus, a verify write operation is completed.

Referring to FIG. 6B corresponding to the storage of data "0" in memory cell MC, storage node SN is maintained at a state where the amount of accumulated holes is low. In this case, bit line BL is driven to an L level (reference potential) and bit line /BL is driven to an H level (control line drive potential VBL) when the sense operation is completed at sense amplifier circuit SA.

When a verify write operation is initiated, charge line CL is driven to an L level from an H level, likewise the case of FIG. 6A. In accordance with this potential reduction at charge line CL, the potential of storage node SN falls from an H level (power supply potential VDD) towards an L level (reference potential) by the gate coupling effect. Thus, a state of the amount of charge being low (a state where the amount of accumulated holes is substantially "0") is established at storage node SN.

Since word line WL is driven to an H level and bit line BL is driven to an L level, access transistor ATR (FIG. 3) of memory cell MC is rendered active. Accordingly, the potential of node PN attains the potential of word line WL, i.e. the L level (reference potential). Therefore, the potential of storage node SN is maintained at an L level without holes being introduced into storage node SN.

Then, the potential of storage node SN rises by the threshold voltage in the forward direction of storage transistor STR in accordance with the drive of charge line CL to an H level from an L level. Since this increase is small as compared to power supply potential VDD, the problem of erroneous writing does not occur. Then, word line WL and bit line pair BL, /BL are driven to an L level. Thus, a verify write operation is completed.

Semiconductor memory device 1 according to the first embodiment of the present invention writes read data again to memory cell MC subsequent to reading out data from that memory cell MC.

Although the above description in conjunction with FIGS. 5A-5I and FIGS. 6A and 6B is based on the case where data is read out with respect to memory cell MC arranged at an even numbered column, i.e. connected to bit line BL, in memory array 8 of FIG. 2, the same applies to memory cell MC arranged at an odd numbered column, i.e. connected to bit line /BL. In the case where data is to be read out from memory cell MC arranged at an odd numbered column, word line /WL, dummy word line DWL, and charge line /CL are employed instead of word line WL, dummy word line /DWL and charge line CL, respectively, in the description set forth above.

<Sense Amplifier Circuit>

As described above, sense amplifier circuit SA amplifies the potential difference between bit lines BL and /BL to read out data stored in memory cell MC. In semiconductor memory device 1 according to the first embodiment of the present invention, the ground precharge scheme of supplying the reference potential to bit line pair BL, /BL prior to a reading operation is employed. Therefore, the potentials at bit lines BL and /BL substantially correspond to the level of reference potential immediately after initiating a read out operation, as shown in FIGS. 5H and 5I. As a result, there may be the problem that transistors 30A and 30B operating primarily at sense amplifier circuit SA (FIG. 2) are not readily rendered active.

In view of this problem, it is preferable to use a gate-body direct-coupled transistor having the gate electrode electrically connected to its body region for transistors 30A and 30B constituting sense amplifier circuit, SA in semiconductor memory device 1.

Figure 7:
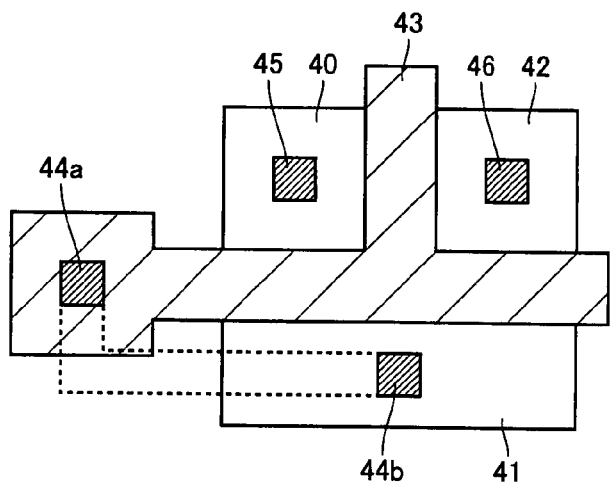
FIG. 7 is a plan view of an example of a configuration of a gate-body direct-coupled transistor.

FIG. 7 is a plan view of an example of such a gate-body direct-coupled transistor.

The gate-body direct-coupled transistor of FIG. 7 includes n-type impurity diffusion regions 40 and 42 formed on an SOI substrate, a body region 41, and a gate electrode 43 formed in a T shape. Impurity diffusion regions 40 and 42 are electrically connected to bit line BL (or /BL) or another transistor via contacts 45 and 46, respectively. Gate electrode 43 is electrically connected to bit line BL (or /BL) via contact 44a, and also electrically connected to contact 44b formed at body region 41.

According to such a configuration, the potential of gate electrode 43 can be rendered consistent with the potential of body region 41. Since the aforementioned transistor can be rendered active at a lower potential as compared to a transistor that changes the potential of the body region by gate coupling, a stable sense operation can be conducted even in the case where the potentials generated at bit lines BL and /BL are low.

Figure 8A:
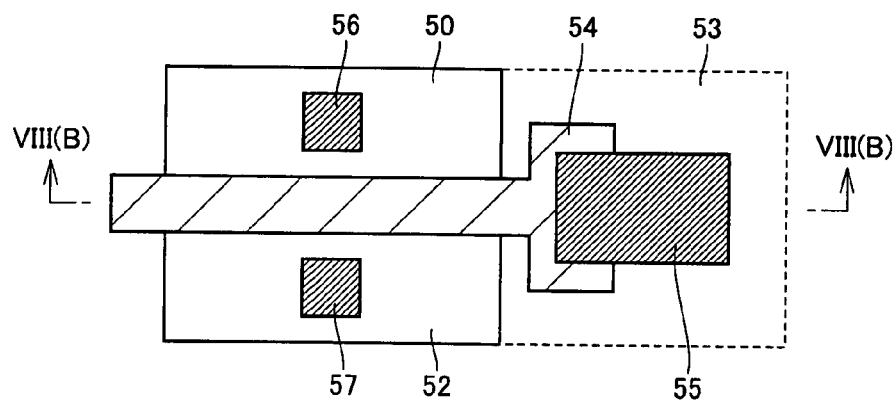
FIGS. 8A and 8B are plan views of another example of a configuration of a gate-body direct-coupled transistor.
Figure 8B:
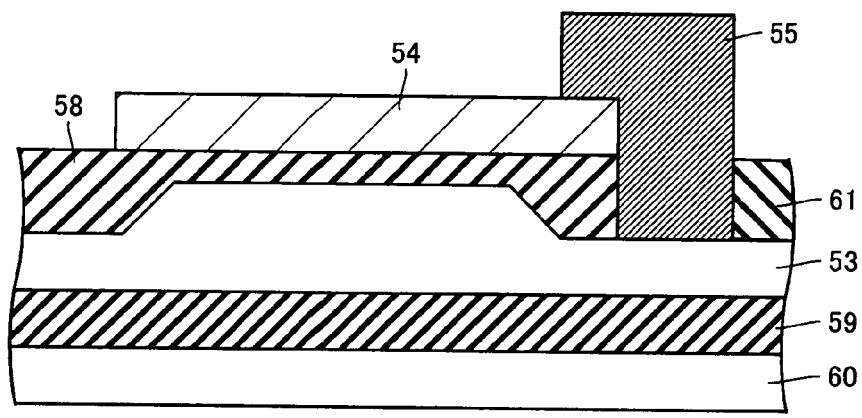

FIGS. 8A and 8B represent another example of a gate-body direct-coupled transistor. FIG. 8A is a plan view, and FIG. 8B is a sectional view taken along line VIII (B)-VIII(B) of FIG. 8A.

The gate-body direct-coupled transistor shown in FIGS. 8A and 8B includes n-type impurity diffusion regions 50 and 52 formed on an SOI substrate, a body region 53, and a gate electrode 54. Impurity diffusion regions 50 and 52 are electrically connected to bit line BL (or /BL) or another transistor via contacts 56 and 57, respectively. Gate electrode 54 is electrically connected to bit line BL (or /BL) via a contact 55.

As shown in FIG. 8B, body region 53 is formed on silicon substrate 60 qualified as the semiconductor substrate with a buried oxide layer 59 qualified as an insulating layer thereunder. A gate oxide film 58 is formed between gate electrode 54 and body region 53. Body region 53 has a portion thereof formed at the silicon substrate side (lower portion in the drawing sheet) of adjacent element isolation insulating film 61. Contact 55 is formed through element isolation insulating film 61, and electrically connected to body region 53.

By the configuration set forth above, the potential of gate electrode 54 can be set to match the potential of body region 53. Therefore, since the transistor can be rendered active by a lower potential as compared to the transistor that changes the potential of the body region by gate coupling, a stable sense operation can be conducted even in the case where the potentials at bit lines BL and /BL are low.

<Page Access Operation>

Random access of reading out data from a corresponding memory cell MC by arbitrarily selecting one word line WL (or /WL) and one column select line CSL has been described above. In semiconductor memory device 1 according to the first embodiment of the present invention shown in FIG. 2, page access of sequentially reading out data can be executed on at least two memory cells MCs corresponding to bit line pairs BL, /BL, differing from each other.

Such page access is particularly effective in the case where data is to be read out sequentially from a plurality of memory cells MC arranged continuously corresponding to the same row. For example, in the case where pixel data is stored in memory array 8 consistent with the pixel arrangement displayed on the screen such as in a graphic drawing processing, data reading of high speed can be realized by employing such page access. In other words, since pixel data displayed on a screen is scanned according to a predetermined rule and cycle, page access that allows sequential data read out with respect to a plurality of memory cells MC arranged continuously corresponding to the same row on memory array 8 is more effective.

In semiconductor memory device 1 according to the first embodiment of the present invention, a verify write operation is executed after a read out operation. In page access, a verify write operation (rewriting of read data) with respect to a plurality of memory cells MC subjected to a reading operation is executed at one time.

Referring to FIG. 2 again, reading out data sequentially with respect to four memory cells MC, connected to word line WL0 and to respective bit lines BL0, BL1, BL2 and BL3 will be described hereinafter as an example of a page access operation.

Figure 9A:
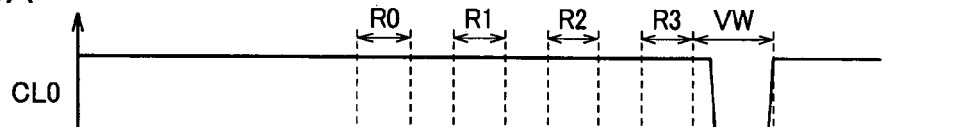
FIGS. 9A-9I are operation timing charts of page access.
Figure 9B:
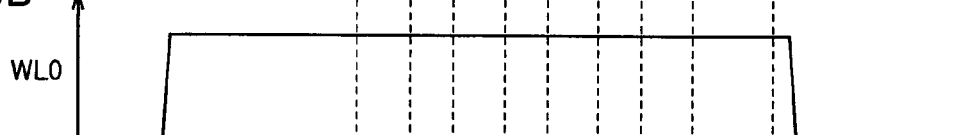
Figure 9C:
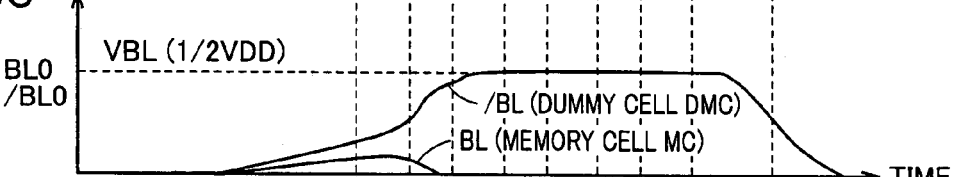
Figure 9D:
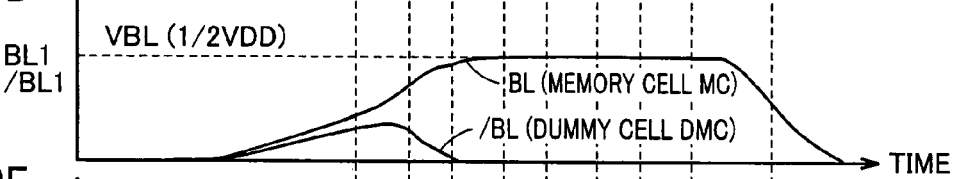
Figure 9E:
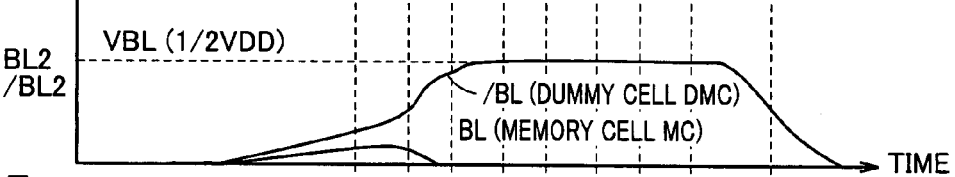
Figure 9F:
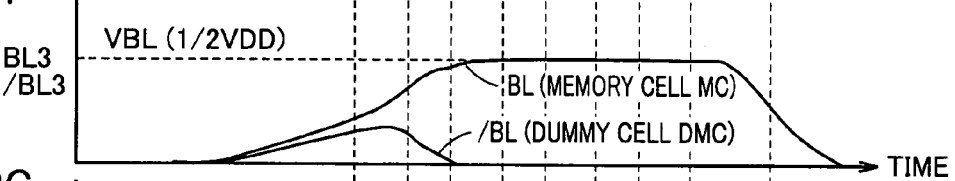
Figure 9G:
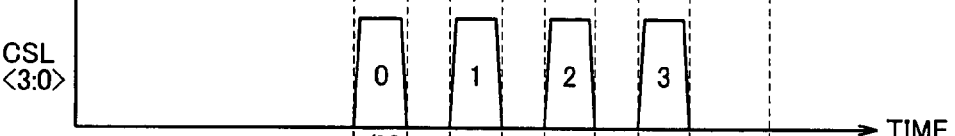
Figure 9H:
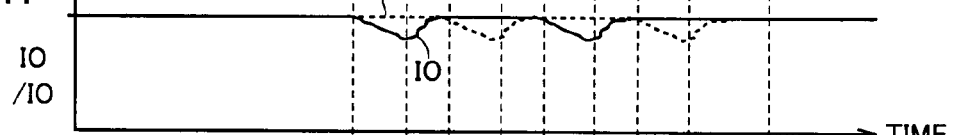
Figure 9I:
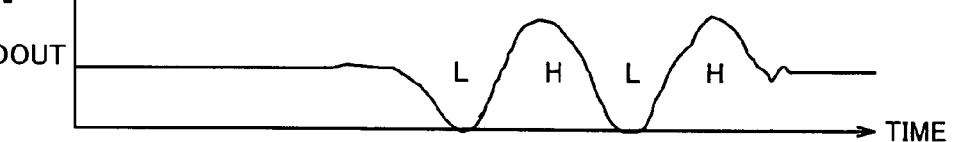

FIGS. 9A-9I are operation timing charts of a page access. FIG. 9A shows the temporal change in charge line CL0. FIG. 9B represents the temporal change in word line WL0. FIG. 9C represents the temporal change in bit lines BL0 and /BL0. FIG. 9D represents the temporal change in bit lines BL1 and /BL1. FIG. 9E represents the temporal change in bit lines BL2 and /BL2. FIG. 9F represents the temporal change in bit lines BL3 and /BL3. FIG. 9G represents the temporal change in column select signal CSL <3:0>. FIG. 9H represents temporal change of data input/output lines IO and /IO. FIG. 9I represents the temporal change in output data DOUT.

Referring to FIG. 2 and FIGS. 9A-9I, control circuit 7 (FIG. 1) drives word line WL0 corresponding to the row where the target memory cell MC is arranged to an H level, as shown in FIG. 9A. Then, likewise FIGS. 5D-5F, control circuit 7 drives bit line precharge line BLP, and sense amplifier drive lines SON and /SOP to an L level, an H level, and an L level, respectively (not shown).

In response, all sense amplifier circuits SA including the four sense amplifier circuits SA corresponding to bit line pair BL, /BL to bit line pair BL3, /BL3 initiate a sense operation. In other words, each sense amplifier circuit SA conducts a data reading operation from memory cell MC located at the left most side arranged at an even numbered column in memory array 8.

For example, when data "0" is stored in memory cells MC connected to bit lines BL0 and BL2 and data "1" is stored in memory cells MC connected to bit lines BL1 and BL3, the potentials of bit line pair BL0, /BL0 to bit line pair BL3, /BL3 bit line pairs exhibit the temporal change shown in FIGS. 9C-9F, respectively.

When each sense amplifier circuit SA completes a sense operation, and voltage of a level corresponding to read data is supplied to corresponding bit line pair BL0, /BL0 to bit line pair BL3, /BL3, control circuit 7 initiates the output operation of the read data. In other words, control circuit 7 sequentially provides the read data to data input/output line pair IO, /IO.

Specifically, control circuit 7 first drives column select line CSL0 to an H level (period R0), as shown in FIG. 9G. Accordingly, the voltage generated at bit line pair. BL, /BL is transmitted to data input/output line pair IO, /IO. Then, control circuit 7 drives column select line CSL1 to an H level (period R1). Accordingly, the voltage generated at bit line pair BL, /BL is transmitted to data input/output line pair IO, /IO. In a similar manner, control circuit 7 sequentially drives column select lines CSL2 and CSL3 to an H level (period R2 and period R3).

In accordance with the sequential select drive of column select lines CSL0-CSL3, a voltage signal as shown in FIG. 9H appears at data input/output line IO, /IO. Further, input/output circuit 3 (FIG. 1) provides the voltage signal of data input/output line pair IO, /IO outside semiconductor memory device 1 as output data DOUT. Thus, the voltage signal as shown in FIG. 9I is output as output data DOUT.

When the data read out operation set forth above is completed, control circuit 7 drives charge line CL0 to an L level to render storage transistor STR of each memory cell MC inactive once, and then drives charge line CL0 to an H level to render storage transistor STR active again. Accordingly, a verify write operation is executed at one time with respect to each sense amplifier circuit SA (period VW). In other words, data corresponding to the level of voltage generated at a corresponding bit line pair BL, /BL is rewritten to each memory cell MC since charge line CL0 is shared by respective memory cells MC. The details of a verify write operation of each memory cell MC have been provided above, and will not be repeated here.

When a verify write operation is completed, word line WL0 is driven to an L level. Thus, data reading ends.

Control circuit 7 is configured to selectively allow execution of the random access and page access set forth above according to an externally applied page access mode signal PMOD and the like.

According to the first embodiment of the present invention, control circuit 7 effects control such that a read out operation is conducted by sense amplifier circuit SA in a state of storage transistor STR of memory cell MC in an active state, and then effects control to render the relevant storage transistor STR once inactive and then active again such that the read data is rewritten (verify write operation). Accordingly, erroneous writing (disturb) caused by noise to storage node SN during data reading can be avoided to improve the retaining capability of stored data in data reading.

According to the first embodiment of the present invention, control circuit 7 effects control such that corresponding transfer gate TG is rendered non-conductive to electrically disconnect a corresponding memory cell MC from the currently-operating sense amplifier circuit SA according to the read out operation at sense amplifier circuit SA. Therefore, the effect of parasitic capacitance at memory array 8 can be reduced, allowing the sense operation (amplify operation) of sense amplifier circuit SA to be conducted at higher speed. Thus, a semiconductor memory device having the speed of data reading further increased can be realized.

The first embodiment of the present invention allows execution of page access for sequentially reading out data from at least two memory cells MCs corresponding to different bit line pairs BL, /BL, in addition to the random access for conducting data reading bit-by-bit from one selected arbitrary memory cell MC. In page access, rewriting of the read data with respect to each memory cell MC (verify write operation) can be executed at one time. Accordingly, data reading can be realized at higher speed in the case where data is to be sequentially read out from a plurality of memory cells MC that are arranged continuously corresponding to one row (for example, in graphic drawing processing), as compared to the random access in which a read out operation and a verify write operation are repeated for every one memory cell MC.

The first embodiment of the present invention is configured employing a gate-body direct-coupled transistor having a gate electrode electrically connected to the body region for sense amplifier circuit SA. Accordingly, erroneous operation of sense amplifier circuit SA can be avoided even in the case where the ground precharge scheme in which the reference potential is supplied to bit line pair BL, /BL prior to a read out operation is employed. Thus, a stable data read out operation can be realized.

Second Embodiment

The schematic diagram of a semiconductor memory device according to a second embodiment of the present invention is similar to that of the semiconductor memory device of the first embodiment shown in FIGS. 1 and 2. Therefore, detailed description thereof will not be repeated. In the second embodiment of the present invention, the circuit configuration of the sense amplifier is arbitrary. A circuit configuration other than that of sense amplifier 9 shown in FIG. 2 may be employed. In the second embodiment of the present invention, channel formation region 23 corresponds to "channel formation region". Impurity diffusion region 24 and impurity diffusion region 22 correspond to "first impurity diffusion region" and "second impurity diffusion region", respectively.

The second embodiment of the present invention will be described based on a data retaining operation in a state where data "0" is stored in memory cell MC. i.e. the amount of accumulated holes at storage node SN is low.

Figure 10A:
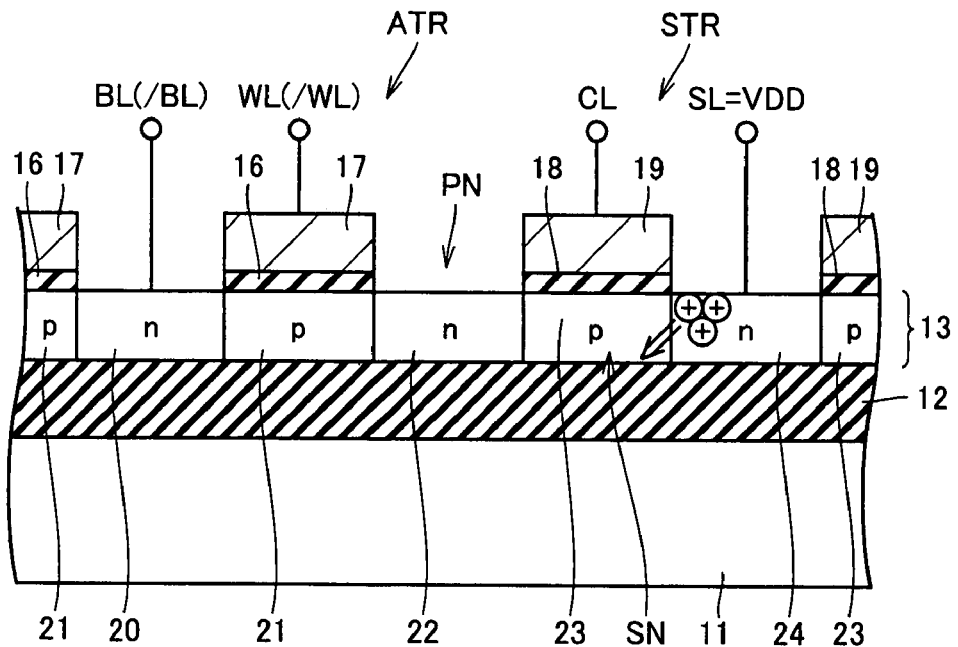
FIGS. 10A and 10B are diagrams to describe the phenomenon occurring when data "0" is stored into a memory cell.
Figure 10B:
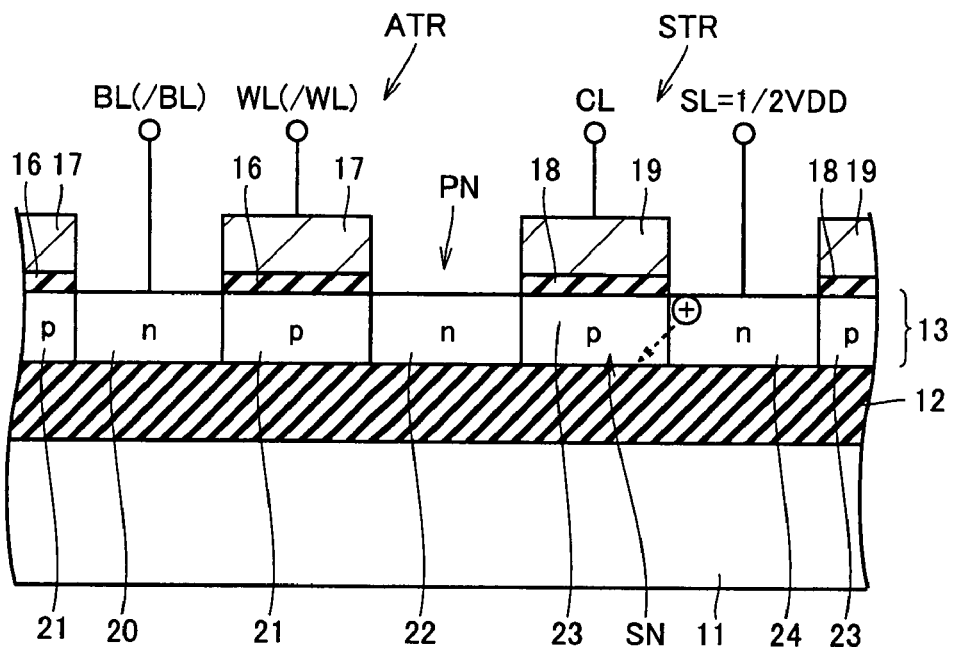

FIG. 10A and 10B are diagrams to describe the phenomenon occurring when data "0" is stored in memory cell MC, the former corresponding to the case of driving source line SL at power supply potential VDD, and the latter corresponding to the case of driving source line SL at a potential lower than power supply potential VDD.

As shown in FIG. 6B described above, storage node SN is maintained at an L level (≈reference potential) when data "0" is stored in memory cell MC. Impurity diffusion region 24 in contact with the storage node is connected to source line SL, supplied with power supply potential VDD, as shown in FIG. 10A. Therefore, there is a potential difference corresponding to power potential VDD between storage node SN and impurity diffusion region 24. As a result, junction leakage current of backward bias occurs from impurity diffusion region 24 towards storage node SN by a relatively high electric field generated at the junction between storage node SN and impurity diffusion region 24.

By this junction leakage current, holes will be introduced from impurity diffusion region 24 (source line SL) into storage node SN. By this hole introduction, the amount of accumulated holes at storage node SN is increased, approaching the state of storing data "1". This means that destruction of data "0" occurs at memory cell MC. Therefore, in the case where memory cell MC as shown in FIG. 10A is employed, a refresh operation (rewriting stored data) must be conducted prior to the destruction of data "0". The problem of data destruction is much less acute when data "1" is stored in memory cell MC since sufficient holes are accumulated.

It is to be noted that power will be consumed corresponding to the frequency of refresh operation even during the period at which memory access (data reading and data writing) is not conducted, i.e. even during a retaining operation period, since data reading and data writing are executed with respect to memory cell MC in a refresh operation, By reducing the potential difference between storage node SN and impurity diffusion region 24, the period of time before destruction of data "0", i.e. the data retaining time, can be lengthened. By increasing the data retaining time, the frequency of such a refresh operation can be reduced.

As one method of increasing the data retaining time, the field intensity between storage node SN and impurity diffusion region 24 can be reduced by supplying potential lower than power supply potential VDD to source line SL, as shown in FIG. 10B. FIG. 10B corresponds to the case where half the level (½ VDD) of power supply potential VDD employed as control line drive potential VBL is taken as the potential of source line SL.

By reducing the potential supplied to impurity diffusion region 24 via source line SL, the potential difference between storage node SN and impurity diffusion region 24 can be reduced to lower the frequency of a refresh operation.

Figure 11:
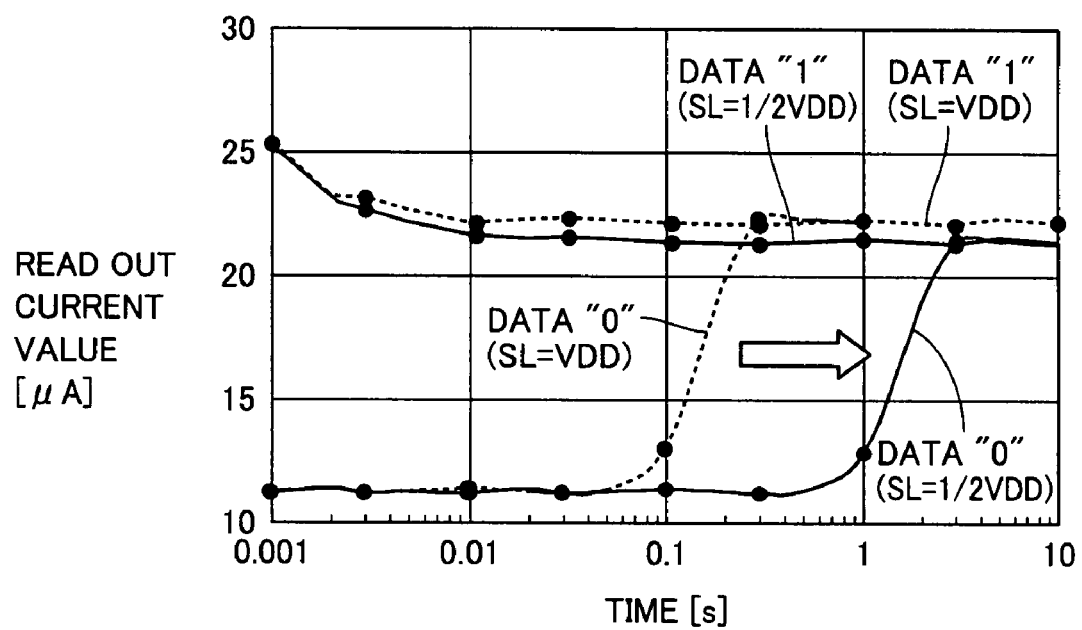
FIG. 11 is a diagram to describe improvement of data retaining capability of a memory cell by reducing source line potential.

FIG. 11 is a diagram to describe the improvement of the data retaining capability of memory cell MC by reducing the potential of source line SL. FIG. 11 represents a graph of the temporal change in the level of the read current flowing from memory cell MC to a corresponding bit line BL in memory array 8 of FIG. 2, based on different levels of potential supplied to source line SL.

In the case where the potential supplied to source line SL is power supply potential VDD, the read current flowing from memory cell MC where data "0" is stored to bit line BL begins to increase at approximately 0.1 [s]. This read current becomes equal to the level of the read current from a memory cell MC where data "1" is stored at approximately 0.2 to 0.3 [s]. Therefore, a refresh operation must be conducted for this memory cell MC within the period of approximately 0.1 [s].

In the case where the potential supplied to source line SL is reduced down to ½ VDD, the read current flowing from memory cell MC where data "0" is stored to bit line BL maintains its level without increasing during the period of approximately 1 [s]. In other words, the period of a refresh operation can be lengthened from 0.1 [s] to 1 [s] by reducing the potential supplied to source line SL down to ½ VDD. This means that the frequency of a refresh operation can be reduced to ¹⁄₁₀.

The read current of memory cell MC where data "1" is stored exhibits substantially an equal temporal change, independent of the potential of source line SL.

The semiconductor memory device according to the second embodiment of the present invention includes a "data retaining mode" in which memory access is suppressed to increase the data retaining time, in addition to "a normal mode" in which memory access (such as data reading and writing) can be executed. The data retaining mode is selectively executed according to an externally applied control signal.

Figure 12A:
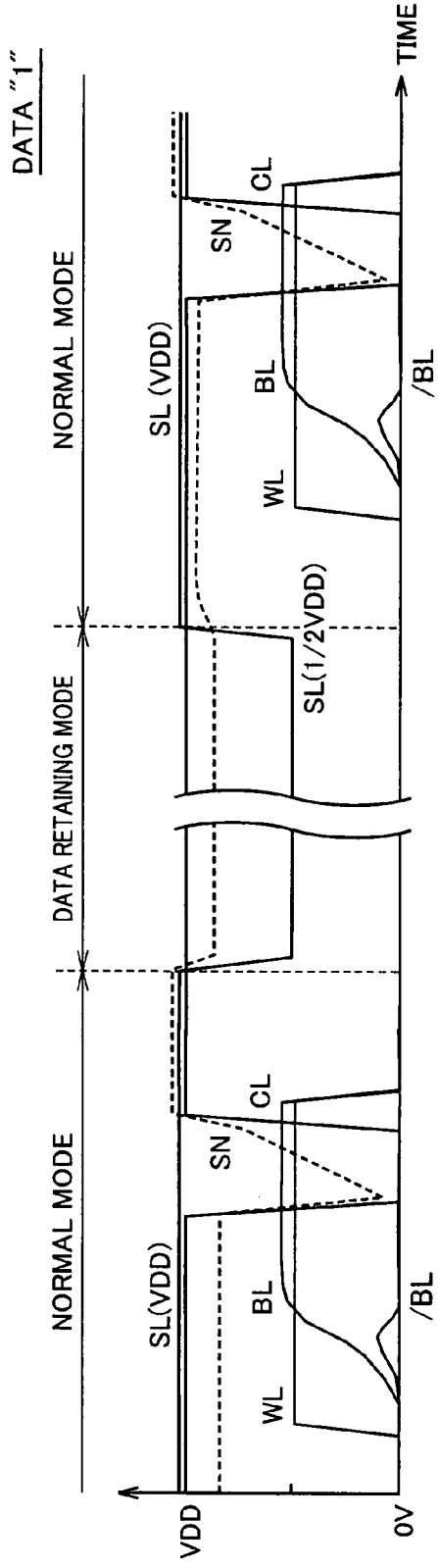
FIGS. 12A and 12B are operation timing charts of "normal mode" and "data retaining mode".
Figure 12B:
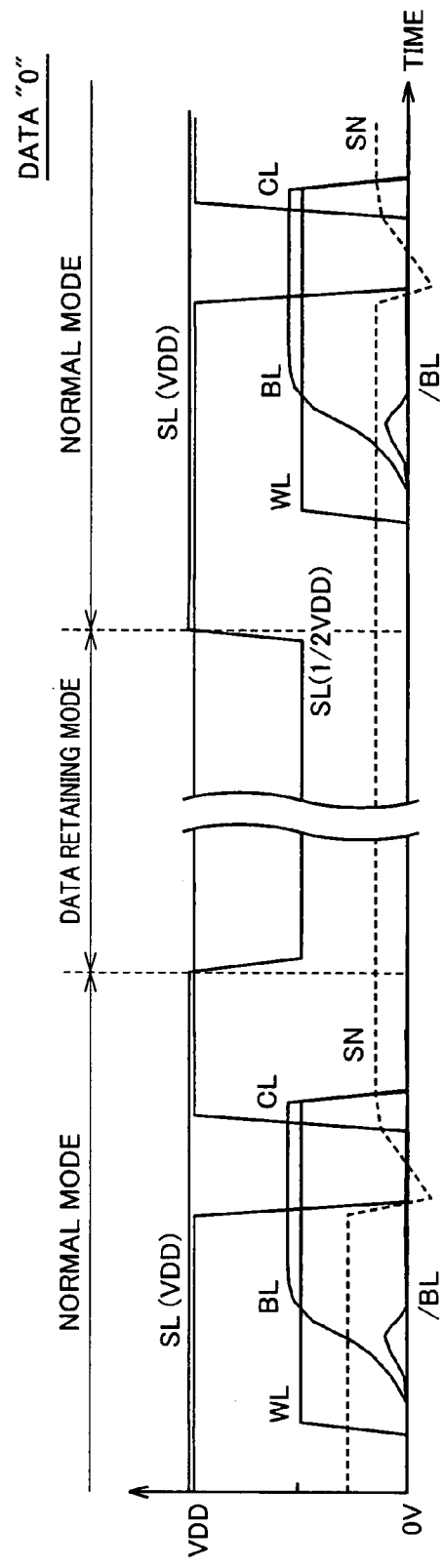

FIGS. 12A and 12B represent the operation timing of a "normal mode" and "data retaining mode", corresponding to the case where data reading is conducted on memory cell MC arranged at an even numbered column in memory array 8 of FIG. 2, i.e. connected to bit line BL.

FIG. 12A represents the case where data "1" is stored in memory cell MC. FIG. 12B represents the case where data "0" is stored in memory cell MC.

It is appreciated from FIGS. 12A and 12B that an operation similar to that of FIGS. 6A and 6B is executed in the normal mode.

When an externally applied control signal designating a data retaining mode is input, control circuit 7 (FIG. 2) effects control such that the potential supplied to source line SL is reduced from the level of power supply potential VDD to ½ VDD.

In the case where data "1" is stored in memory cell MC, the potential of storage node SL is slightly reduced by the capacitive coupling with impurity diffusion region 24, as shown in FIG. 12A. However, when the potential of source line SL is restored to the level of power supply potential VDD by the termination of the control signal designating a data retaining mode or by a newly input of a control signal designating a normal mode, the potential of storage node SN also rises to the former level. Therefore, the operation prior to initiating a data retaining mode can be continued following the end of a data retaining mode.

In the case where data "0" is stored in memory cell MC as shown in FIG. 12B, the potential of storage node SN is not affected in a data retaining mode. Therefore, when the data retaining mode ends and the potential of source line SL is restored to the level of power supply potential VDD, the operation prior to the data retaining mode can be continued.

By the transition to a data retaining mode based on reduction of the potential supplied to source line SL and then returning to a normal mode by restoring the former level of potential, a configuration of selectively executing a data retaining mode in response to a control signal can be realized relatively readily.

Although memory access cannot be executed in a data retaining mode, power consumption for a refresh operation can be suppressed. Therefore, this configuration is suitable for an application (such as a mobile terminal) in which the demand of reducing power consumption is given priority over the demand of the access speed (processing rate).

Although the above description is based on the case where power supply potential VDD supplied to charge line CL is reduced to ½ VDD, the level of this potential is not restricted thereto. In other words, the data retaining time can be increased by reducing the potential of the charge line CL in a normal mode to a lower arbitrary potential.

According to the second embodiment of the present invention, the potential difference between storage node SN of storage transistor STR and impurity diffusion region 24 is reduced to suppress the junction leakage current of backward bias flowing from impurity diffusion region 24 towards storage node SN. Accordingly, the data retaining time of memory cell MC can be increased, allowing a longer refresh cycle.

Thus, the frequency of a refresh operation can be reduced to lower the overall power consumption of the semiconductor memory device.

The second embodiment of the present invention allows execution of a data retaining mode by reducing the potential supplied via source line SL. Since source line SL is shared by many memory cells MC, the number of source lines SL corresponding to potential reduction is relatively low even in a semiconductor memory device formed of many memory cells MC. Therefore, the circuitry to reduce the potential supplied to source line SL can be made relatively simple. Thus, a data retaining mode can be realized with substantially the same circuit area.

<Modification>

A configuration of reducing the potential supplied to source line SL has been described, based on an example of reducing the potential difference between storage node SN and impurity diffusion region 24 in the second embodiment of the present invention.

A modification of the second embodiment will be described hereinafter, based on a configuration of reducing the potential difference between storage node SN and impurity diffusion 24 by supplying predetermined potential to the SOI substrate where storage node SN is formed.

Figure 13:
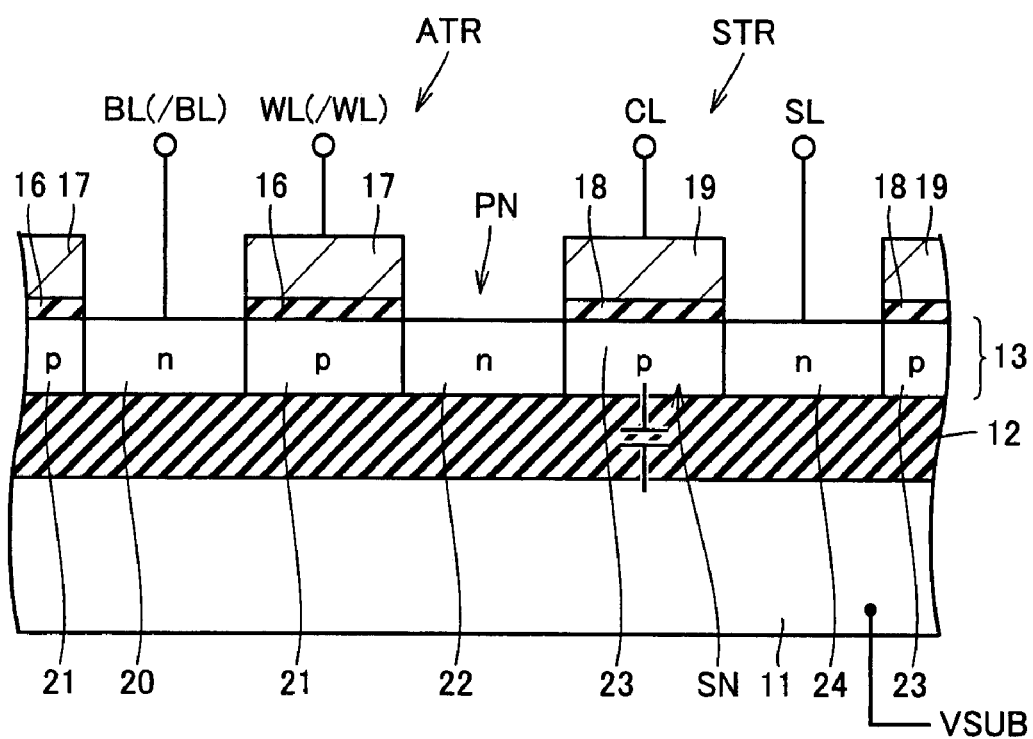
FIG. 13 is a schematic sectional view of a memory cell according to a modification of a second embodiment of the present invention.

Referring to FIG. 13, the memory cell according to a modification of the second embodiment is equivalent to memory cell MC of the first embodiment shown in FIG. 4 in that substrate potential VSUB can be supplied to silicon substrate 11. The plurality of memory cells constituting the same memory array are generally formed on the same silicon substrate. Therefore, it is only necessary to electrically connect the source of supplying substrate potential VSUB (power supply circuit) to at least one region of silicon substrate 11 in a semiconductor memory device with a plurality of memory cells arranged.

By the configuration set forth above, the potential of silicon substrate 11 rises to the level of the supplied substrate potential VSUB. Accordingly, the potential of storage node SN maintained at the floating potential rises as a result of the capacitive coupling between storage node SN and silicon substrate 11. In contrast, the capacitive coupling between impurity diffusion region 24 and silicon substrate 111 will not cause potential increase since power potential VDD is supplied to impurity diffusion region 24 via source line SL.

In other words, the potential of storage node SN rises whereas the potential of impurity diffusion region 24 does not change. Therefore, the potential difference between storage node SN and impurity diffusion region 24 can be reduced. Accordingly, the data retaining time can be lengthened to reduce the frequency of a refresh operation.

In the modification of the second embodiment, substrate potential VSUB is supplied to silicon substrate 11 in response to reception of a control signal designating a data retaining mode, and supply of substrate potential VSUB to silicon substrate 11 is cut upon reception of a control signal designating the termination of the data retaining mode. The other elements are similar to those of the second embodiment set forth above. Therefore, detailed description will not be repeated.

According to a modification of the second embodiment, a data retaining mode can be executed by supplying substrate potential VSUB to the semiconductor substrate where memory cells MC are formed. Since many memory cells MC are formed generally on the same semiconductor substrate, the number of semiconductor substrates to which substrate potential VSUB is supplied is low even in a semiconductor memory device formed of many memory cells MCs. Therefore, the circuit to supply substrate potential VSUB to the semiconductor substrate can be made relatively simple. Thus, a data retaining mode can be realized with substantially the same circuit area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a plurality of memory cells arranged in rows and columns,
a bit line provided corresponding to each column of memory cells,
a sense amplifier circuit provided corresponding to each bit line pair formed of said bit lines, and
a control circuit, wherein
each of said memory cells includes a storage transistor having a storage node to accumulate an amount of charge according to data, and an access transistor connected in series with said storage node, and
each of said memory cells is connected between a corresponding bit line and source line, and configured to change current flowing through said corresponding bit line according to the amount of charge accumulated in said storage node,
said sense amplifier circuit reads out data of a relevant memory cell based on current flowing from said relevant memory cell to a corresponding bit line, and then supplies voltage according to the read data to a relevant bit line pair,
said control circuit effects control such that a read operation is conducted by said sense amplifier circuit corresponding to a target memory cell in a state of said storage transistor of said target memory cell being active, and then effects control such that the read data is rewritten to said target memory cell.

2. The semiconductor memory device according to claim 1, wherein said control circuit renders the storage transistor of said target memory cell once inactive and then active again when the read data is to be rewritten to said target memory cell.

3. The semiconductor memory device according to claim 1, further comprising a transfer gate provided corresponding to each said bit line pair, allowing electrical connection/disconnection between said sense amplifier circuit and a corresponding memory cell,
wherein said control circuit effects control to render a corresponding transfer gate non-conductive such that said corresponding memory cell is electrically disconnected from said sense amplifier circuit according to a read operation at said sense amplifier circuit.

4. The semiconductor memory device according to claim 1, further comprising a dummy cell connected between each of a plurality of bit lines and reference potential,
wherein said sense amplifier circuit reads out data based on a comparison between current flowing through said target memory cell and current flowing through said dummy cell connected to a bit line of said bit line pair having a complementary bit line corresponding to said target memory cell.

5. The semiconductor memory device according to claim 1, further comprising:
a word line pair provided corresponding to each row of memory cells,
an input/output gate provided corresponding to each said bit line pair, allowing electrical connection/disconnection between a corresponding sense amplifier circuit and a data input/output line, and
a column select line provided corresponding to each said input/output gate, wherein
one word line of said word line pair is shared by access transistors of memory cells at each even numbered column and the other word line is shared by access transistors of memory cells at each odd numbered column among corresponding memory cells,
said control circuit is configured to arbitrarily select one word line and one column select line to allow random access of reading out data from a corresponding memory cell.

6. The semiconductor memory device according to claim 5, wherein said control circuit is configured to allow page access of sequentially reading out from at least two memory cells corresponding to bit line pairs differing from each other, and
in said page access, rewriting of each read data to said at least two memory cells subjected to a reading operation is executed at one time.

7. The semiconductor memory device according to claim 6, wherein said control circuit is configured to selectively allow execution of said random access and said page access according to a control signal.

8. The semiconductor memory device according to claim 1, wherein said memory cell includes
a first channel formation region constituting said storage transistor,
first and second impurity diffusion regions opposite to each other with said first channel formation region therebetween,
a gate electrode of said storage transistor, arranged in proximity to said first channel formation region,
a second channel formation region constituting said access transistor,
a third impurity diffusion region opposite to said second impurity diffusion region with said second channel formation region therebetween, and
a gate electrode of said access transistor arranged in proximity to said second channel formation region,
said storage node formed in contact with said first channel formation region at a side opposite to the side where the gate electrode of said storage transistor is arranged.

9. The semiconductor memory device according to claim 1, wherein
said sense amplifier circuit includes first to fourth transistors,
said first and second transistors are connected in series, and have a connection node connected to one bit line of a corresponding bit line pair,
said third and fourth transistors are connect in series, and have a connection node connected to the other bit line of said corresponding bit line pair,
said other bit line connected to the gate electrodes of said first and second transistors,
said one bit line connected to the gate electrodes of said third and fourth transistors,
each of said second and fourth transistors has its gate electrode electrically connected to its body region.

10. A semiconductor memory device comprising:
a plurality of memory cells arranged in rows and columns,
a bit line provided corresponding to each column of memory cells,
a source line to supply predetermined potential to each of said plurality of memory cells, and
a control circuit, wherein each of said memory cells includes a storage transistor having a storage node to accumulate an amount of charge according to data, said storage transistor including a channel formation region, first and second impurity diffusion regions opposite to each other with said channel formation region therebetween, and a gate electrode arranged in proximity to said channel formation region, said storage node formed in contact with said channel formation region at a side opposite to the side where said gate electrode is arranged, said source line being electrically connected to said first impurity diffusion region, said control circuit configured to allow execution of a data retaining mode of reducing a potential difference between said storage node and said first impurity diffusion region.

11. The semiconductor memory device according to claim 10, wherein said control circuit reduces a potential difference between said first impurity diffusion region and said channel formation region by effecting control to reduce potential supplied to said memory cell via said source line.

12. The semiconductor memory device according to claim 10, wherein said channel formation region and said first and second impurity diffusion regions are formed on a semiconductor substrate with an insulating layer thereunder, said control circuit reduces a potential difference between said first impurity diffusion region and said channel formation region by effecting control to supply predetermined potential to said semiconductor substrate.

13. The semiconductor memory device according to claim 10, wherein said control circuit is configured to selectively allow execution of said data retaining mode according to a control signal.

14. A semiconductor memory device comprising:

a plurality of memory cells arranged in rows and columns, each of said plurality of memory cells including an access transistor and a storage transistor connected in series, each of said access transistor and said storage transistor having first and second impurity regions formed at a silicon layer formed on a semiconductor substrate with an insulating layer thereunder, a body region arranged between said first and second impurity regions, and a gate electrode region formed on said body region, a plurality of bit lines provided corresponding to a column of said plurality of memory cells, connected to the first impurity region of said access transistor of a corresponding memory cell, a plurality of source lines provided corresponding to a row of said plurality of memory cells, connected to the second impurity region of said storage transistor of a corresponding memory cell, a plurality of word lines provided corresponding to a row of said plurality of memory cells, connected to the gate electrode region of said access transistor of a corresponding memory cell, a plurality of charge lines provided corresponding to a row of said plurality of memory cells, connected to the gate electrode region of said storage transistor of a corresponding memory cell, a plurality of sense amplifiers provided corresponding to a plurality of bit line pairs formed of a pair of said bit lines, sensing and amplifying read data from a selected memory cell, a data line pair selectively connected to said plurality of bit line pairs, and a plurality of input/output gates provided between said plurality of bit line pairs and said data line pair, rendered conductive by activation of a column select signal selecting a bit line pair connected to said data line pair among said plurality of bit line pairs, wherein a data read operation mode includes an active period of a column select signal corresponding to a selected memory cell and an inactive period of a charge line after said active period of a column select signal, during an active period of a word line corresponding to said selected memory cell.

15. The semiconductor memory device according to claim 14, wherein a sense amplifier activation signal rendering said plurality of sense amplifiers active is rendered active after activation of said word line and prior to activation of said column select signal, and rendered inactive after said inactive period of a charge line.

16. The semiconductor memory device according to claim 14, wherein said plurality of memory cells include a dummy cell qualified as a comparison target when detecting read data from a selected memory cell, a current according to stored data of a selected memory cell flows through one bit line of said bit line pair and a current according to stored data of said dummy cell flows to the other bit line of said bit line pair for detection of a current difference by a corresponding sense amplifier in said data read operation mode.

* * * * *